United States Patent [19]

Kawabata et al.

[11] Patent Number: 4,953,283

[45] Date of Patent: Sep. 4, 1990

[54] METHOD OF HANDLING ELECTRONIC COMPONENT CHIPS

[75] Inventors: Shoichi Kawabata; Hisanao Tsuge; Hiromichi Wakatsuki, all of Kyoto, Japan

[73] Assignee: Murata Manufacturing Co., Ltd., Japan

[21] Appl. No.: 276,618

[22] Filed: Nov. 28, 1988

[30] Foreign Application Priority Data

Nov. 28, 1987 [JP] Japan .................. 62-301062

[51] Int. Cl.⁵ .................. B23P 11/02; H05K 3/30
[52] U.S. Cl. .................. 29/593; 29/450; 29/359; 29/834; 29/840; 29/759; 118/503; 324/158 F; 427/79
[58] Field of Search .................. 29/837–840, 29/739, 740, 741, 759, 834, 450, 593, 559; 427/79–81; 118/503; 324/158 F

[56] References Cited

U.S. PATENT DOCUMENTS 3,617,045  11/1971  DeCosta et al. .
3,976,288  8/1976   Cuomo, Jr. .
4,381,321  4/1983   Braden .
4,393,808  5/1987   Braden .................. 118/503
4,664,943  7/1983   Nitta et al. .................. 118/503 X

FOREIGN PATENT DOCUMENTS 2949196  7/1980  Fed. Rep. of Germany .
3441984  5/1985  Fed. Rep. of Germany .
707398   4/1954  United Kingdom .
983344   2/1965  United Kingdom .

Primary Examiner—Carl E. Hall
Attorney, Agent, or Firm—Ostrolenk, Faber, Gerb & Soffen

[57] ABSTRACT

A holder for holding a plurality of electronic component chips, each of which is provided with external terminal electrodes on both of longitudinal ends thereof, has a plurality of receiving portions defined by through holes for receiving respective ones of the electronic component chips one by one. An elastic member is formed on an inner peripheral surface defining each of the receiving portions, for elastically holding each of the electronic component chips. Each electronic component chip is received in each receiving portion to be longitudinally and crosswisely oriented toward a direction orthogonal to the axis of the receiving portion. This electronic component chip holder is advantageously employed to perform various operations such as measurement, marking, taping, magazinization and mounting of the electronic component chips.

21 Claims, 5 Drawing Sheets

METHOD OF HANDLING ELECTRONIC COMPONENT CHIPS

BACKGROUND OF THE INVENTION

1. Field of the Invention

The present invention relates to an electronic component chip holder for holding electronic component chips in an operation for measuring the electronic component chips, for example. The invention also relates to a method of using such an electronic component chip holder, and more specifically, it relates to a method of handling electronic component chips in case of performing an operation such as measurement, for example.

Throughout the specification, the term "electronic component chips" includes the so-called partially fabricated items to be subjected to marking, soldering to electrodes, mounting of lead wires and the like, for example, in addition to finished chip-type electronic components to be directly mounted on circuit boards.

2. Description of the Background Art

In order to meet the demand for smaller and thinner electronic devices, electronic components employed therein have been so miniaturized that even those of dimensions breaking the order of millimeters are now commercially available.

Such electronic component chips must be subjected to various operations such as measurement, marking, taping, magazinization, mounting and the like, for example, before the same are shipped or mounted on appropriate circuit boards. However, it is relatively difficult to efficiently perform these operations on such small articles as electronic component chips. In particular, difficulty in handling of the electronic component chips is increased with progress in miniaturization thereof.

In order to perform the aforementioned operations on the electronic component chips, an electronic component chip holder, which can simultaneously hold a large number of electronic component chips, has been generally used in the plant of the assignee. FIG. 16 is a sectional view showing such a conventional electronic component chip holder 2, which holds electronic component chips 1. This electronic component chip holder 2 is entirely in the form of a plate, which is prepared by a metal plate, for example. The holder 2 is provided on one surface thereof with a plurality of receiving portions 3, which are in the form of cavities. The receiving portions 3 are generally distributed to form rows and columns along the plane of the holder 2. The respective receiving portions 3 receive the electronic component chips 1 relatively with allowance. The electronic component chips 1 received in the receiving portions 3 are longitudinally and crosswisely oriented along the plane of the holder 2, i.e., along the sectional direction of the receiving portions 3. In order to facilitate the operation for receiving the chips 1 in an arbitrary oriented state, the receiving portions 3 are provided with suction holes 4 in bottom surface walls thereof, to supply negative pressure through the suction holes 4.

The electronic component chips 1 thus held by the holder 2 can be easily handled through the holder 2, even if the same are miniaturized. Further, the electronic component chips 1 can be efficiently handled since a large number of such electronic component chips 1 can be held by a single holder 2.

The electronic component chips 1 held by the holder 2 as shown in FIG. 16 are subjected to various operations such as marking, taping, magazinization and the like. For example, the marking operation is performed on exposed surfaces of the electronic component chips 1, which are held by the holder 1. In the operation for taping or magazinization, on the other hand, the electronic component chips 1 held by the holder 2 are first upwardly raised by a vacuum suction chuck or the like, for example, then sidewardly carried and thereafter downwardly moved, to be introduced into a station for taping or magazinization.

However, in the aforementioned marking operation, for example, it is impossible to mark both of opposite surfaces of the electronic component chips 1 while holding the same by the holder 2. In order to perform the operation for taping or magazinization, on the other hand, the electronic component chips 1 held by the holder 2 must be subjected to at least upward, sideward and downward movements. Thus, there is yet room for improvement in the holder 2, in view of working efficiency. This also applies to the case of mounting on a circuit board the electronic component chips 1 through the holder 2. Further, although the electronic component chips 1 are subjected to measurement of capacitance, resistance, withstand voltage and the like depending on the types thereof, it is improper to perform operations for such measurement while holding the electronic component chips 1 by the holder 2 in the mode shown in FIG. 16. The holder 2, being made of a metal, may cause a short across external terminal electrodes 5 and 6, which are provided on both ends of each electronic component chip 1. Further, a measuring terminal to be connected with the external terminal electrodes 5 and 6 may be simultaneously brought into contact with the holder 2 of a metal, to disable measurement. Even if the holder 2 is formed of an electrical insulating material, the measuring terminal may be displaced from the external terminal electrodes 5 and 6 because of incorrect positioning of the electronic component chips 1, which are received in the receiving portions 3 with relatively wide allowance.

SUMMARY OF THE INVENTION

Accordingly, an object of the present invention is to provide an electronic component chip holder, which can solve the aforementioned problems of the background art.

Another object of the present invention is to provide a method of using the aforementioned electronic component chip holder, i.e., a method of handling electronic component chips through use of such a holder.

The present invention provides a holder for holding a plurality of electronic component chips, each of which has dimensions along longitudinal, crosswise and perpendicular directions being orthogonal to each other, wherein the longitudinal dimension has the longest size and the crosswise dimension has the second longest size. In order to solve the aforementioned technical problems, the inventive electronic component chip holder has the following structure:

The holder is provided with a plurality of receiving portions, which are defined by through holes, for receiving respective ones of the plurality of electronic component chips one by one.

Each of the receiving portions has sectional dimensions which can receive the longitudinal and crosswise dimensions of each electronic component chip.

An elastic member is provided on at least a pair of opposite portions of an inner peripheral surface defining each of the receiving portions, for elastically holding each electronic component chip.

The present invention also provides a method of handling a plurality of electronic component chips having the aforementioned dimensional relation. In order to solve the technical problems, the inventive method of handling electronic component chips comprises: a step of preparing an electronic component chip holder provided with a plurality of receiving portions defined by through holes for receiving respective ones of the plurality of electronic component chips one by one, which receiving portions each has a sectional configuration capable of receiving the longitudinal and crosswise dimensions of each electronic component chip and is provided with an elastic member on at least a pair of opposite portions of an inner peripheral surface defining each receiving portion for elastically holding each electronic component chip; a step of inserting respective ones of the plurality of electronic component chips into the respective receiving portions to longitudinally and crosswisely orient the same toward the sectional direction of the receiving portions while elastically holding the same by the elastic members, thereby to hold the plurality of electronic component chips by the electronic component chip holder; and a step of handling the plurality of electronic component chips which are held by the electronic component chip holder.

According to the inventive electronic component chip holder, a plurality of electronic component chips can be so received in the receiving portions that the same are longitudinally and crosswisely oriented toward the sectional direction of the receiving portions. Further, the respective electronic component chips are elastically held by the elastic members provided in the receiving portions, which are defined by through holes.

According to the inventive electronic component chip holder, therefore, measurement of capacitance, resistance, withstand voltage and the like can be performed on electronic component chips while holding the same in the holder, by preparing the elastic members from a highly insulative material and holding the electronic component chips while bringing external terminal electrodes thereof into contact with such elastic members.

Further, each of the electronic component chips is longitudinally and crosswisely oriented toward the sectional direction of each receiving portion to be received in the receiving portion, which is defined by a through hole, whereby both of the widest opposite pair of surfaces of the electronic component chip, i.e., those suitable for marking, can be exposed from openings provided in both ends of the receiving portion. Thus, marking can be easily performed on both surfaces of the electronic component chips while moving the electronic component chips received in the receiving portions at need.

Since each of the receiving portions is defined by a through hole as hereinabove described, the electronic component chip received therein can be easily discharged from one opening of the receiving portion by pushing the same from the other opening by a pusher or the like. Through such an operation, taping, magazinization, mounting or the like can be directly performed on the electronic component chips held by the holder.

According to the inventive electronic component chip holder, a series of operations for measurement, marking and taping or magazinization, for example, can be performed on the electronic component chips while holding the same by the same holder, thereby to improve efficiency of these operations. Such an effect is particularly remarkable when the electronic component chips to be held by the inventive holder are too small for direct handling. Further, the inventive holder can be adapted to store a plurality of electronic component chips while holding the same.

According to the inventive method of handling electronic component chips, a plurality of electronic component chips are handled while being held by a common electronic component chip holder. Therefore, even if the electronic component chips are too small for direct handling, a large number of such electronic component chips can be efficiently subjected to operations such as measurement, marking, taping, magazinization and the like.

Further, a series of operations for measurement, marking and taping or magazinization, or for measurement, marking and mounting can be performed on the respective electronic component chips while holding the same by a common holder, whereby the operations can be successively performed with no interruption.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
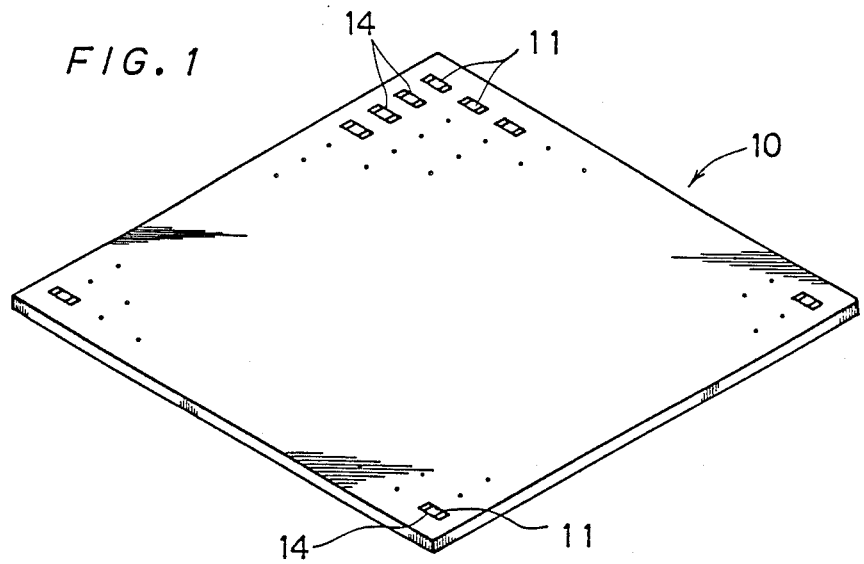
FIG. 1 is a perspective view showing the appearance of an electronic component chip holder 10 according to an embodiment of the present invention.

FIG. 1 is a perspective view showing an electronic component chip holder 10 according to an embodiment of the present invention. The holder 10 is entirely in the form of a plate. Such a holder 10 is preferably formed by a metal plate in view of its low thermal expansion coefficient except for specific parts as hereinafter described; however, the same may alternatively be formed by a resin plate, for example.

Figure 2:
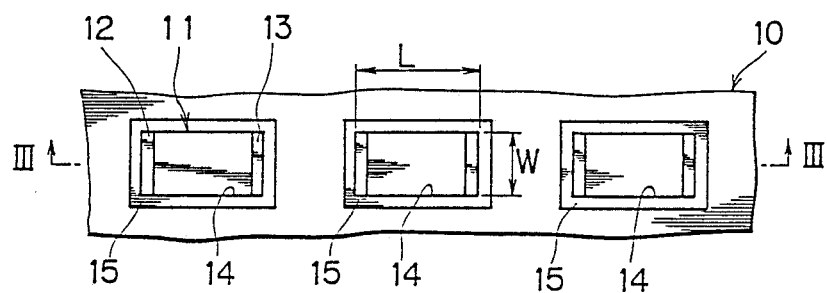
FIG. 2 is a fragmentary enlarged plan view of the holder 10 shown in FIG. 1.
Figure 3:
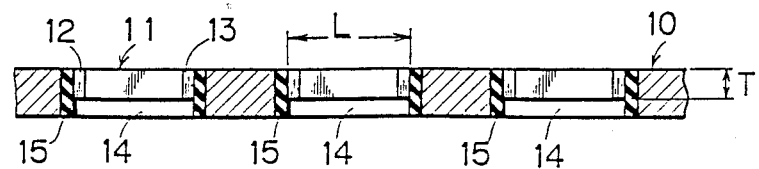
FIG. 3 is a sectional view taken along the line III—III in FIG. 2.
Figure 4:
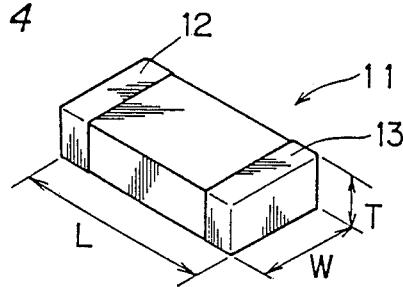
FIG. 4 is a perspective view independently showing an electronic component chip 11 to be received in each of receiving portions 14 shown in FIGS. 1 to 3.

FIG. 2 is a fragmentary enlarged plan view of the holder 10 shown in FIG. 1. FIG. 3 is a sectional view taken along the line III—III in FIG. 2. The holder 10 shown in FIGS. 1 to 3 already holds electronic component chips 11, the appearance of which is shown in FIG. 4. The electronic component chips 11 may be formed by capacitor chips such as laminated ceramic capacitors, resistor chips, or inductor chips. Each of such chips 11 has dimensions L, W and T along longitudinal, crosswise and perpendicular directions, which are orthogonal to each other. Of these, the longitudinal dimension L has the longest size and the crosswise dimension W has the second longest size. The perpendicular dimension T may be equal to the crosswise dimension W. Further, each chip 11 is provided with external terminal electrodes 12 and 13 on both of longitudinal ends thereof.

In order to receive a plurality of such electronic component chips 11 one by one, the holder 10 is provided with a plurality of receiving portions 14, which are distributed to form rows and columns along the plane thereof, as shown in FIGS. 1, 2 and 3. The respective receiving portions 14 are defined by through holes perpendicularly passing through the holder 10, as shown in FIG. 3.

As shown in FIG. 2, each receiving portion 14 has sectional dimensions which can receive the longitudinal and crosswise dimensions L and W of each chip 11. An elastic member 15 is formed on an inner peripheral surface defining each receiving portion 14, for elastically holding each chip 11. The elastic member 15 is formed of a natural or synthetic resin material having appropriate elasticity. The material for the elastic member 15 is preferably prepared from a highly insulative one having relatively high heat resistance, as obvious from the following description. In this point of view, silicone rubber is selectable as one of optimum materials for the elastic member 15. According to this embodiment, the elastic member 15 is formed entirely over the inner peripheral surface defining the receiving portion 14.

Thus, the respective ones of the plurality of electronic component chips 11 are inserted into the respective receiving portions 14 to be longitudinally and crosswisely oriented toward the surface direction of the holder 10, i.e., the sectional direction of the receiving portions 14 while being elastically held by the elastic members 15, whereby the plurality of electronic component chips 11 are held by the holder 10. Such a state is obtained through a step shown in FIG. 5, for example.

Figure 5:
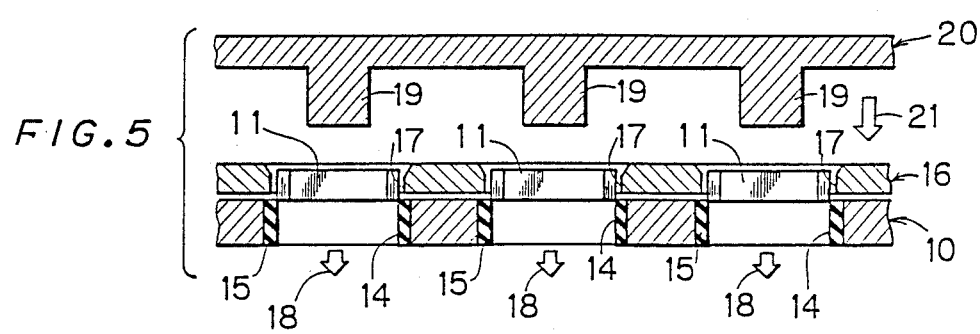
FIG. 5 is a sectional view for illustrating a step of inserting the electronic component chips 11 in the receiving portions 14 of the holder 10.

Referring to FIG. 5, an orienting apparatus 16 is placed on the holder 10. The orienting apparatus 16 is provided with orienting portions 17 in positions corresponding to the receiving portions 14 which are formed in the holder 10. The orienting portions 17 are defined by through holes perpendicularly passing through the orienting apparatus 16, which is in the form of a plate, and the depth thereof is selected, for example, to receive the electronic component chips 11 one by one. For example, a large number of chips 11 are placed at random on the orienting apparatus 16, which in turn is subjected to horizontal or inclined vibration to insert the chips 11 into all of the orienting portions 17. Among the chips 11, those remaining on the orienting apparatus 16 are then removed. In order to facilitate such insertion of the chips 11 into the orienting portions 17, vacuum suction may be applied to the orienting portions 17 through the receiving portions 14, as shown by arrows 18, for example.

Then, a pusher 20 having projections 19 in positions corresponding to the orienting portions 17 is employed to move the electronic component chips 11 from the orienting portions 17 into the receiving portions 14. Upon movement along an arrow 21, the pusher 20 acts on the chips 11 positioned in the orienting portions 17, to push the same into the receiving portions 14. At this time, the elastic members 15 are elastically deformed to receive the chips 11. Thus, the plurality of electronic component chips 11 are held by the holder 10, as shown in FIGS. 1 to 3.

The electronic component chips 11 are subjected to various operations while being held by the holder 10. For example, capacitance, resistance, withstand voltage and the like can be efficiently measured by bringing measuring terminals into contact with the external terminal electrodes 12 and 13, both of which are exposed through openings of the receiving portions 14. Particularly the external terminal electrodes 12 and 13 are in contact with only the elastic members 15, and hence measurement can be performed in higher reliability by preparing the elastic members 15 from a highly insulative material.

Figure 6:
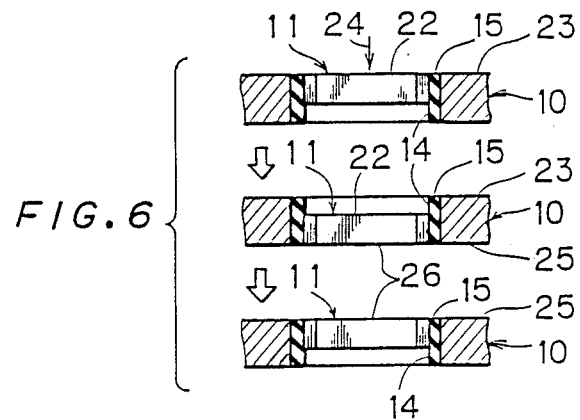
FIG. 6 is a sectional view for illustrating a step of marking both surfaces of the electronic component chips 11.

Further, marking can be performed on both surfaces of the electronic component chips 11, while holding the same by the holder 10. As shown in the upper stage of FIG. 6, one surface 22 of each chip 11 upwardly deviatingly positioned in the receiving portion 14 is marked upon alignment with one surface of the holder 10. Then, the chip 11 is pressed along an arrow 24 to downwardly deviate in the receiving portion 14, as shown in the intermediate stage of FIG. 6. Thereafter the holder 10 is turned over to mark the other surface 26 of the chip 11, which in turn is aligned with the other surface 25 of the holder 10. Thus, marking can be performed on the surface 22 and the other surface 26 of the chip 11, while holding the same in the holder 10. Such marking can be performed by means of screen printing, pad printing or the like. The material for the elastic member 15 preferably has high heat resistance, since the elastic member 15 is heated to some extent in such a marking operation.

Figure 7:
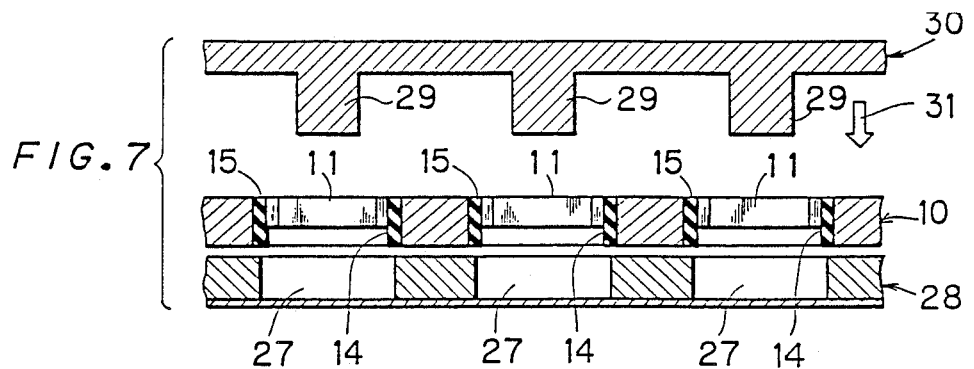
FIG. 7 is a sectional view for illustrating a step of taping the electronic component chips 11 held by the holder 10.

FIG. 7 shows a step of taping the electronic component chips 11 through the holder 10. Referring to FIG. 7, a tape-type supporter 28, which has cavities 27 in positions corresponding to the receiving portions 14 of the holder 10, is provided under the holder 10. A pusher 30 having projections 29 in positions corresponding to the receiving portions 14 is provided above the holder 10 to be movable along an arrow 31. A prescribed number of chips 11 are simultaneously inserted into corresponding ones of the cavities 27 upon single movement of the pusher 30 along the arrow 31. Thus, the chips 11 can be efficiently taped through simple equipment.

Magazinization can also be efficiently performed in a similar manner to the above. Further, a mounting step can also be carried out by arranging the holder 10 on a circuit board (not shown) and relatively moving the holder 10 with respect to the circuit board to place a prescribed chip 11 on a prescribed position of the circuit board by a downwardly movable pusher, a vacuum suction chuck or the like when the chip 11 is located above the said position of the circuit board.

FIGS. 8 to 14 show various modifications of receiving portions provided in electronic component chip holders according to other embodiments of the present invention.

Figures 8, 9:
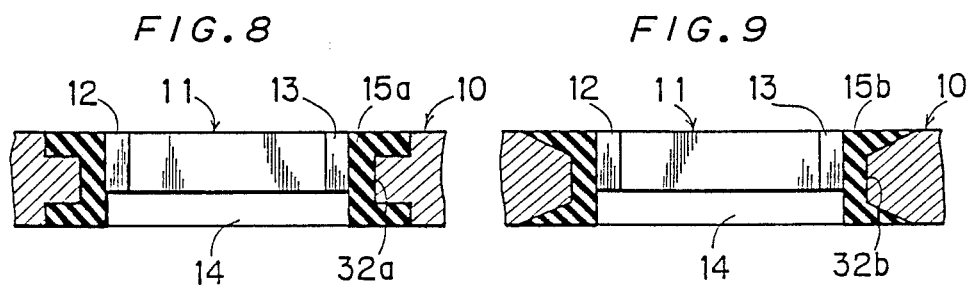
FIGS. 8 to 11 are longitudinal sectional views showing parts of holders 10 according to other embodiments of the present invention.

In the embodiment shown in FIG. 8, each elastic member 15a has a recess 32a for partially receiving the body of a holder 10.

In the embodiment shown in FIG. 9, each elastic member 15b has a recess 32b which is similar to the above. This recess 32b is substantially identical to the aforementioned recess 32a, except for that the same has a tapered side surface.

Figure 10:
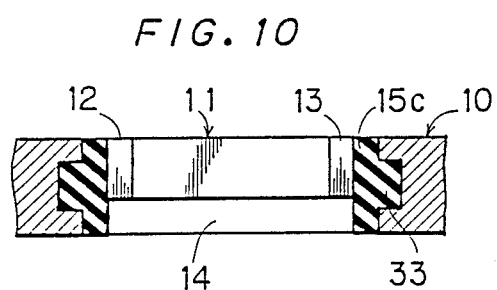

In the embodiment shown in FIG. 10, each elastic member 15c has a projection 33 which is perpendicularly engaged into an intermediate portion of a holder 10.

In the embodiments shown in FIGS. 8 to 10, the elastic members 15a, 15b and 15c are provided with the recesses 32a and 32b and the projection 33 respectively, to improve integrality between the same and the holders 10, which are formed of materials different from each other.

Figure 11:
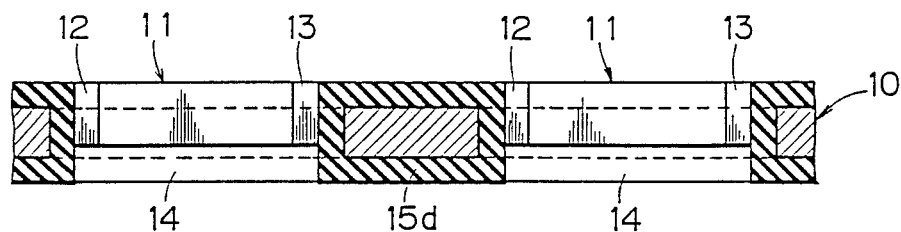

In the embodiment shown in FIG. 11, each elastic member 15d is not only provided on an inner peripheral surface defining each receiving portion 14, but extends along both surface parts of a holder 10. Therefore, when the elastic member 15d is formed of a highly insulative material, measurement of each electronic component chip 11 can be performed with no problem even if a measuring terminal to be brought into contact with external terminal electrodes 12 and 13 thereof is extremely displaced toward the holder 10. Such an effect can also be expected to some extent in the embodiment shown in FIG. 8 or 9. Also in the embodiment shown in FIG. 11, integrality between the body of the holder 10 and the elastic member 15d can be further improved.

Figure 12:
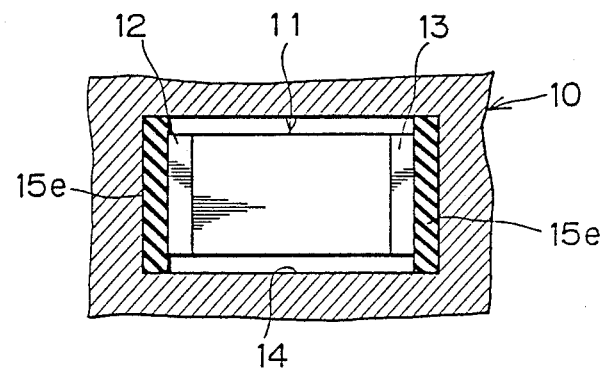
FIGS. 12 to 14 are cross-sectional views showing parts of holders 10 according to further embodiments of the present invention.

In the embodiment shown in FIG. 12, elastic members 15e are formed on opposite sides of each receiving portion 14 only in positions to be brought into contact with longitudinal ends of each electronic component chip 11.

Figure 13:
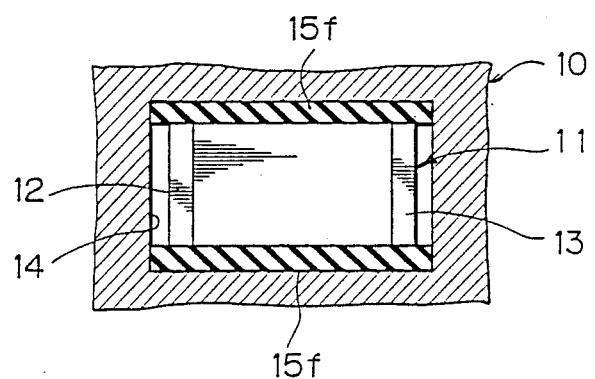

In the embodiment shown in FIG. 13, elastic members 15f are formed on opposite sides of each receiving portion 14 only in positions to be brought into contact with crosswise end portions of each electronic component chip 11.

The embodiment shown in FIG. 12 or 13 is significant in showing that it is sufficient to provide the elastic member on at least a pair of opposite portions of the inner peripheral surface defining each receiving portion.

Figure 14:
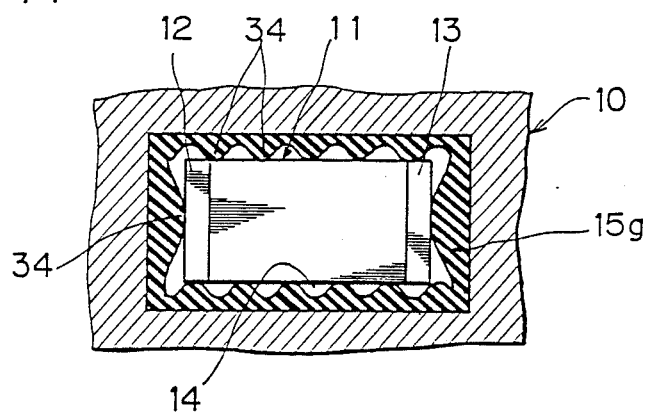

In the embodiment shown in FIG. 14, a plurality of projections are provided in each elastic member 15g, to be in contact with each electronic component chip 11. This embodiment is significant in showing that a portion of the elastic member to be brought into contact with the electronic component chip may be in any configuration so far as the same can elastically hold the electronic component chip in a prescribed position.

Figure 15:
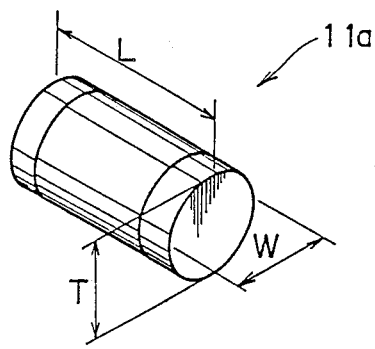
FIG. 15 is a perspective view showing an example of a cylindrical electronic component chip 11a, to which the present invention may be applied.
Figure 16:
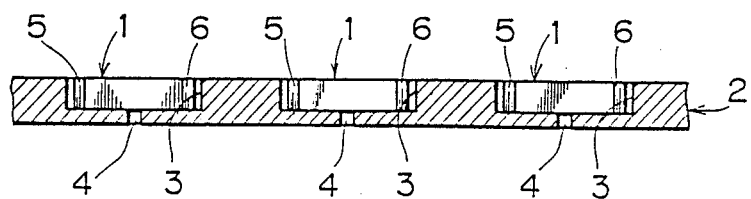
FIG. 16 is a sectional view showing an electronic component chip holder 2 forming the background art of the present invention.

The electronic component chip to which the present invention is applied is not restricted to that in the form of a rectangular parallelopiped as shown in FIG. 4, for example, A cylindrical electronic component chip 11a is also employable as shown in FIG. 15, for example. Such a cylindrical electronic component chip 11a also has longitudinal, crosswise and perpendicular dimensions L, W and T. The longitudinal dimension L has the longest size and the crosswise direction W, which is equal to the perpendicular dimension T since the same corresponds to the diameter of the cylinder, has the second longest size.

Although the present invention has been described and illustrated in detail, it is clearly understood that the same is by way of illustration and example only and is not to be taken by way of limitation, the scope of the present invention being limited only by the terms of the appended claims.

What is claimed is:

1. A method of handling a plurality of electronic component chips each having dimensions along longitudinal, crosswise and perpendicular directions measured orthogonal to each other, wherein said longitudinal dimension has the longest size and said crosswise dimension has the second longest size, said method comprising:

preparing an electronic component chip holder which is provided with a plurality of receiving portions defined by through holes for receiving respective ones of said plurality of electronic component chips, each of said receiving portions having a sectional configuration capable of receiving said longitudinal and crosswise dimensions of each said electronic component chip and being provided with an elastic member on at least a pair of opposite portions of an inner peripheral surface defining each said receiving portion for elastically holding each said electronic component chip;

inserting respective ones of said plurality of electronic component chips into said receiving portions to longitudinally and crosswisely orient the same toward the sectional direction of said receiving portions while elastically holding the same by said elastic member, thereby to hold said plurality of electronic component chips by said electronic component chip holder;

wherein the electronic component chips are inserted into the holder such that each of said electronic component chips is received in a respective one of said receiving portions and selected regions of said chip are exposed through respective openings of said receiving portion;

contacting said exposed regions of said chips through said openings while holding said chips in said component chip holder; and handling said plurality of electronic component chips while holding the same by said electronic component chip holder;

wherein said exposed regions of the chip are external terminal electrodes on both ends along the longitudinal direction of the chip, and said contacting step includes contacting said exposed external terminal electrodes through said openings.

2. A method in accordance with claim 1, wherein said holder is formed of a metal except for said elastic member.

3. A method in accordance with claim 1, wherein said elastic member is formed of a highly insulative material having high heat resistance.

4. A method in accordance with claim 1, wherein said elastic member is formed of silicone rubber.

5. A method in accordance with claim 1, wherein said elastic member and portions of said holder except for said elastic member are in contact with each other while forming interfaces by combinations of a recess and a projection.

6. A method in accordance with claim 1, wherein said elastic member is formed to extend along both surfaces of portions of said holder except for said elastic member.

7. A method in accordance with claim 1, wherein said elastic member is provided with a plurality of projections, forward ends of which are brought into contact with each said electronic component chip.

8. A method in accordance with claim 1, wherein said elastic member is formed entirely over the inner peripheral surface defining said receiving portion.

9. A method as in claim 1, wherein said contacting step includes a step of measuring an electrical characteristic of said chip via said external terminals.

10. A method as in claim 1, wherein said exposed regions of said chips are surfaces of said electronic component chips located longitudinally between external terminal electrodes thereof, and said contacting step includes contacting said exposed lateral surfaces of said electronic component chips.

11. A method of handling a plurality of electronic component chips each having dimensions along longitudinal, crosswise and perpendicular directions measured orthogonal to each other, wherein said longitudinal dimension has the longest size and said crosswise dimension has the second longest size, said method comprising:
preparing an electronic component chip holder which is provided with a plurality of receiving portions defined by through holes for receiving respective ones of said plurality of electronic component chips, each of said receiving portions having a sectional configuration capable of receiving said longitudinal and crosswise dimensions of each said electronic component chip and being provided with an elastic member on at least a pair of opposite portions of an inner peripheral surface defining each said receiving portion for elastically holding each said electronic component chip;
inserting respective ones of said plurality of electronic component chips into said receiving portions to longitudinally and crosswisely orient the same toward the sectional direction of said receiving portions while elastically holding the same by said elastic member, thereby to hold said plurality of electronic component chips by said electronic component chip holder;
wherein the electronic component chips are inserted into the holder such that each of said electronic component chips is received in a respective one of said receiving portions and selected regions of said chip are exposed through respective openings of said receiving portion;
contacting said exposed regions of said chips through said openings while the holding said chips in said component chip holder; and
handling said plurality of electronic component chips while holding the same by said electronic component chip holder;
wherein said exposed regions of said chips are surfaces of said electronic component chips located longitudinally between external terminal electrodes thereof, and said contacting step includes contacting said exposed lateral surfaces of said electronic component chips.

12. A method as in claim 11, wherein said contacting step includes marking upon said lateral surface.

13. A method as in claim 11, wherein said contacting step includes a step of inserting said chips into a tape-type support.

14. A method as in claim 13, wherein said step of transferring the chip to a tape-like support is performed by inserting a pushing device through said opening which exposes a lateral surface of said chip.

15. A method in accordance with claim 11, wherein said holder is formed of a metal except for said elastic member.

16. A method in accordance with claim 11, wherein said elastic member is formed of a highly insulative material having high heat resistance.

17. A method in accordance with claim 11, wherein said elastic member is formed of silicone rubber.

18. A method in accordance with claim 11, wherein said elastic member and portions of said holder except for said elastic member are in contact with each other while forming interfaces by combinations of a recess and a projection.

19. A method in accordance with claim 11, wherein said elastic member is formed to extend along both surfaces of portions of said holder except for said elastic member.

20. A method in accordance with claim 11, wherein said elastic member is provided with a plurality of projections, forward ends of which are brought into contact with each said electronic component chip.

21. A method in accordance with claim 11, wherein said elastic member is formed entirely over the inner peripheral surface defining said receiving portion.

* * * * *